(12) United States Patent
Higashiura

(10) Patent No.: US 7,244,475 B2
(45) Date of Patent: Jul. 17, 2007

(54) PLASMA TREATMENT APPARATUS AND CONTROL METHOD THEREOF

(75) Inventor: Tsutomu Higashiura, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 367 days.

(21) Appl. No.: 10/498,268

(22) PCT Filed: Dec. 13, 2002

(86) PCT No.: PCT/JP02/13095

§ 371 (c)(1), (2), (4) Date: Jun. 8, 2004

(87) PCT Pub. No.: WO03/054941

PCT Pub. Date: Jul. 3, 2003

(65) Prior Publication Data

US 2005/0061442 A1 Mar. 24, 2005

(30) Foreign Application Priority Data

Dec. 13, 2001 (JP) .............................. 2001-380196

(51) Int. Cl.
- H05H 1/30 (2006.01)
- C23C 8/00 (2006.01)
- C23F 1/00 (2006.01)

(52) U.S. Cl. ................. 427/575; 427/585; 156/345.28; 156/345.44; 315/111.31

(58) Field of Classification Search .......... 315/111.21, 315/111.31; 156/345.24, 345.28, 345.43, 156/345.44; 427/569, 575, 585

See application file for complete search history.

(56) References Cited

U.S. PATENT DOCUMENTS

| | | | | |
|---|---|---|---|---|
| 5,478,429 A | * | 12/1995 | Komino et al. | 156/345.44 |
| 5,556,549 A | * | 9/1996 | Patrick et al. | 216/61 |
| 6,313,583 B1 | * | 11/2001 | Arita et al. | 315/111.21 |
| 6,685,797 B2 | * | 2/2004 | Matsumoto et al. | 156/345.24 |
| 6,887,339 B1 | * | 5/2005 | Goodman et al. | 156/345.28 |
| 7,096,819 B2 | * | 8/2006 | Chen et al. | 118/723 I |
| 2003/0127188 A1 | * | 7/2003 | Matsumoto et al. | 156/345.1 |

FOREIGN PATENT DOCUMENTS

| | | |
|---|---|---|
| JP | 11-87097 | 3/1999 |
| JP | 2001-7089 | 1/2001 |
| JP | 451306 | 8/2001 |
| JP | 2001-250811 | 9/2001 |
| JP | 462092 | 11/2001 |
| JP | 462209 | 11/2001 |

* cited by examiner

Primary Examiner—Thuy Vinh Tran
(74) Attorney, Agent, or Firm—Crowell & Moring LLP

(57) ABSTRACT

A frequency control circuit (45) controls an oscillation frequency of a second high frequency power source 51 based on a phase difference between a voltage component and a current component measured by a phase difference sensor (41) and an input impedance to an impedance matching device (34) measured by an impedance sensor (42). An amplitude control circuit (44) controls a level of a high frequency electricity output by the second high frequency power source (51) based on an electricity (effective electricity) which is measured by a power sensor (40) and is to be supplied to the impedance matching device (34).

9 Claims, 9 Drawing Sheets

PROCESS CONDITION
MEMORY 64

| PROCESS | INITIAL VALUE OF C1 | VARIABLE RANGE OF CAPACITANCE OF C1 | INITIAL VALUE OF C2 | VARIABLE RANGE OF CAPACITANCE OF CAPACITOR C2 |
|---|---|---|---|---|
| P1 | C11 | R11 | C21 | R21 |
| P2 | C12 | R12 | C22 | R22 |
| P3 | C13 | R13 | C23 | R23 |
| ..... | ..... | ..... | ..... | ..... |
| Pn | C1n | R1n | C2n | R2n |

FIG. 8

PLASMA TREATMENT APPARATUS AND CONTROL METHOD THEREOF

TECHNICAL FIELD

The present invention relates to a plasma processing apparatus which applies a process such as a film forming process and the like to a process target by using plasma.

BACKGROUND ART

In the process of manufacturing a semiconductor device, a plasma processing apparatus for applying a process to the surface of a semiconductor substrate by using plasma is used. As a plasma processing apparatus, for example, an apparatus for applying a Chemical Vapor Deposition (CVD) process is known. Among plasma processing apparatuses, a parallel plate type plasma processing apparatus is widely used because it is excellent in process evenness and the apparatus structure is relatively simple.

Such a plasma processing apparatus as described above employs an impedance matching device including variable reactance elements, in order to reduce the electricity of a reflected wave from a plasma load to a high frequency power source. The impedance matching device has, for example, a capacitor, and can change its capacitance by a mechanical movement such as rotating an electrode constituting the variable capacitor by, for example, rotation-driving a motor based on results of measuring the electricity of a progressive wave, the electricity of a reflected wave, etc. In other words, the impedance matching device can obtain a match between the output impedance of a high frequency power source and the input impedance to an electrode of the plasma processing apparatus, by changing element constants (capacitance, inductance, etc.) of the built-in variable reactance elements such as the variable capacitor and a variable inductance, etc.

In a case where a process condition is changed, the impedance of the plasma load is greatly changed. Therefore, it is necessary to largely change also the impedance of the impedance matching device.

In this case, if the impedance matching device tries to obtain a match of the impedances by allowing the variable reactance elements constituting the impedance matching device to be adjusted within a large variable range, the range of fluctuation of the variable elements will be inevitably too large. Therefore, there is a problem that it takes a long time to reach the matched state, and the time required for processing a substrate is elongated.

Further, according to the above-described prior art, the element constants of the variable reactance elements are changed by a mechanical movement such as rotation-driving of a motor. Therefore, there is a problem that a long time, for example, equal to or more than several seconds, is required for obtaining a match of the impedances. Furthermore, even if the impedance matching device tries to minutely adjust the capacitance of the variable capacitor in response to a change in the characteristic of the plasma, it is difficult to accurately adjust the impedances because of the roughness of the mechanical control. As a result, the plasma becomes unstable in some case.

DISCLOSURE OF INVENTION

The present invention was made in consideration of the above-described circumstance, and it is an object of the present invention to provide a plasma processing apparatus which can shorten the time required for substrate processing, and a method of controlling such a plasma processing apparatus.

It is another object of the present invention to provide a plasma processing apparatus which can generate stable plasma, and a method of controlling such a plasma processing apparatus.

It is yet another object of the present invention to enable high-speed or accurate adjustment of impedances.

To achieve the above objects, a plasma processing apparatus according to a first aspect of the present invention comprises:

a vacuum container (2) in which a substrate is processed with use of a plasma gas;

a plasma generation electrode (5) which is provided in the vacuum container;

a high frequency power source (51) which generates a high frequency electricity to be supplied to the plasma generation electrode (5);

an impedance matching device (34) which matches an input impedance of said plasma generation electrode (5) and an output impedance of said high frequency power source (51);

an impedance sensor (42) which measures a level of an input impedance of said impedance matching device; and a frequency control circuit (45) which controls an oscillation frequency of the high frequency power source based on a measurement result from the impedance sensor.

There may further be provided a phase difference sensor (41) which measures a phase difference between a voltage component and a current component of an electricity to be supplied to the impedance matching device, and the frequency control circuit (45) may control the oscillation frequency of the high frequency power source based on measurement results from the phase difference sensor and the impedance sensor.

There may further be provided a power sensor (40) which measures an electricity to be supplied to the impedance matching device from the high frequency power source, and an output control circuit (44) which controls an output electricity of the high frequency power source based on a measurement result from the power sensor.

There may further be provided a selector (43) which switches selection between the phase difference sensor (41) and the impedance sensor (42) to obtain measurement results from both of them, and the frequency control circuit (45) may control the oscillation frequency of the high frequency power source (51) based on measurement results sequentially obtained due to selections made by the selector (43).

The output control circuit (44) may control the output electricity of the high frequency power source (51) to keep an electricity to be supplied to the impedance matching device constant, and the frequency control circuit (45) may control the oscillation frequency of the high frequency power source (51) to match the input impedance of the impedance matching device (34) and the output impedance of the high frequency power source (51).

The impedance matching device (34) comprises, for example, variable reactance elements (C1, C2), for matching the input impedance of the plasma generation electrode (5) and the output impedance of the high frequency power source (51), and an impedance control circuit (46) which controls element constants of the variable reactance elements (C1, C2) within a range which is preset for each process and which is restricted narrower than an entire variable range of the variable reactance elements.

To achieve the above objects, a plasma processing apparatus according to a second aspect of the present invention comprises:

a vacuum container (2) in which a process target is processed with use of a plasma gas;

a plasma generation electrode (5) which is provided in the vacuum container (2);

a high frequency power source (51) which generates a high frequency electricity to be supplied to the plasma generation electrode;

an impedance matching device (34) which includes variable reactance elements (C1, C2) in order to match an input impedance of the plasma generation electrode (5) and an output impedance of the high frequency power source (51); and an impedance control circuit (46) which controls element constants of the variable reactance elements (C1, C2) included in the impedance matching device (34) within a range which is preset for each process for processing the process target and which is restricted narrower than an entire variable range of the element constants of the variable reactance elements (C1, C2).

The impedance control circuit (46) controls the element constants of the variable reactance elements (C1, C2) at, for example, an initial setting stage of each of a plurality of processes for processing the process target.

The impedance control means stores, for example, control data for controlling the element constants of the variable reactance elements included in the impedance matching device within a range which is restricted narrower than an entire variable range.

There may further be provided a phase difference sensor (41) which measures a phase difference between a voltage component and a current component of an electricity supplied to the impedance matching device (34) from the high frequency power source (51), and an impedance sensor (42) which measures an input impedance of the impedance matching device (34), and the impedance control circuit (46) may control a capacitance of a first variable capacitor (C1) included in the impedance matching device (34) based on a measurement result from the phase difference sensor (41), and may control a capacitance of a second variable capacitor (C2) included in the impedance matching device (34) based on a measurement result from the impedance sensor (42).

To achieve the above objects, a plasma processing method according to a third aspect of the present invention is a control method of a plasma processing apparatus which comprises a vacuum container in which a substrate is processed with use of a plasma gas, a plasma generation electrode which is provided in the vacuum container, a high frequency power source which generates a high frequency electricity to be supplied to the plasma generation electrode, and an impedance matching device which matches an input impedance to the plasma generation electrode and an output impedance of the high frequency power source, the method comprising:

measuring by a power sensor, an electricity to be supplied to the impedance matching device based on a difference between an electricity of a progressive wave from the high frequency power source and an electricity of a reflected wave to the high frequency power source;

controlling by output control means, an output electricity of the high frequency power source based on a measurement result from the power sensor;

measuring by a phase difference sensor, a phase difference between a voltage component and a current component of an electricity to be supplied to the impedance matching device;

measuring by an impedance sensor, a level of an input impedance to the impedance matching device; and controlling by frequency control means, an oscillation frequency of the high frequency power source based on measurement results of the phase difference sensor and the impedance sensor.

The output control means may control the output electricity of the high frequency power source to keep an electricity to be supplied to the impedance matching device constant, and the frequency control means may control the oscillation frequency of the high frequency power source to match the input impedance to the impedance matching device and the output impedance of the high frequency power source.

To achieve the above objects, a plasma processing method according to a fourth aspect of the present invention is a control method of a plasma processing apparatus which comprises a vacuum container in which a substrate is processed with use of a plasma gas, a plasma generation electrode which is provided in the vacuum container, a high frequency power source which generates a high frequency electricity to be supplied to the plasma generation electrode, and an impedance matching device which matches an input impedance to the plasma generation electrode and an output impedance of the high frequency power source, the method comprising:

controlling element constants of variable reactance elements included in the impedance matching device within a range which is preset for each process for processing the substrate and which is restricted narrower than an entire variable range of the variable reactance elements.

BRIEF DESCRIPTION OF DRAWINGS

FIG. 8 is a diagram showing an example of data stored in a process condition memory.

BEST MODE FOR CARRYING OUT THE INVENTION

A plasma processing apparatus according to the embodiment of the present invention will be explained below with reference to the drawings.

Figure 1:
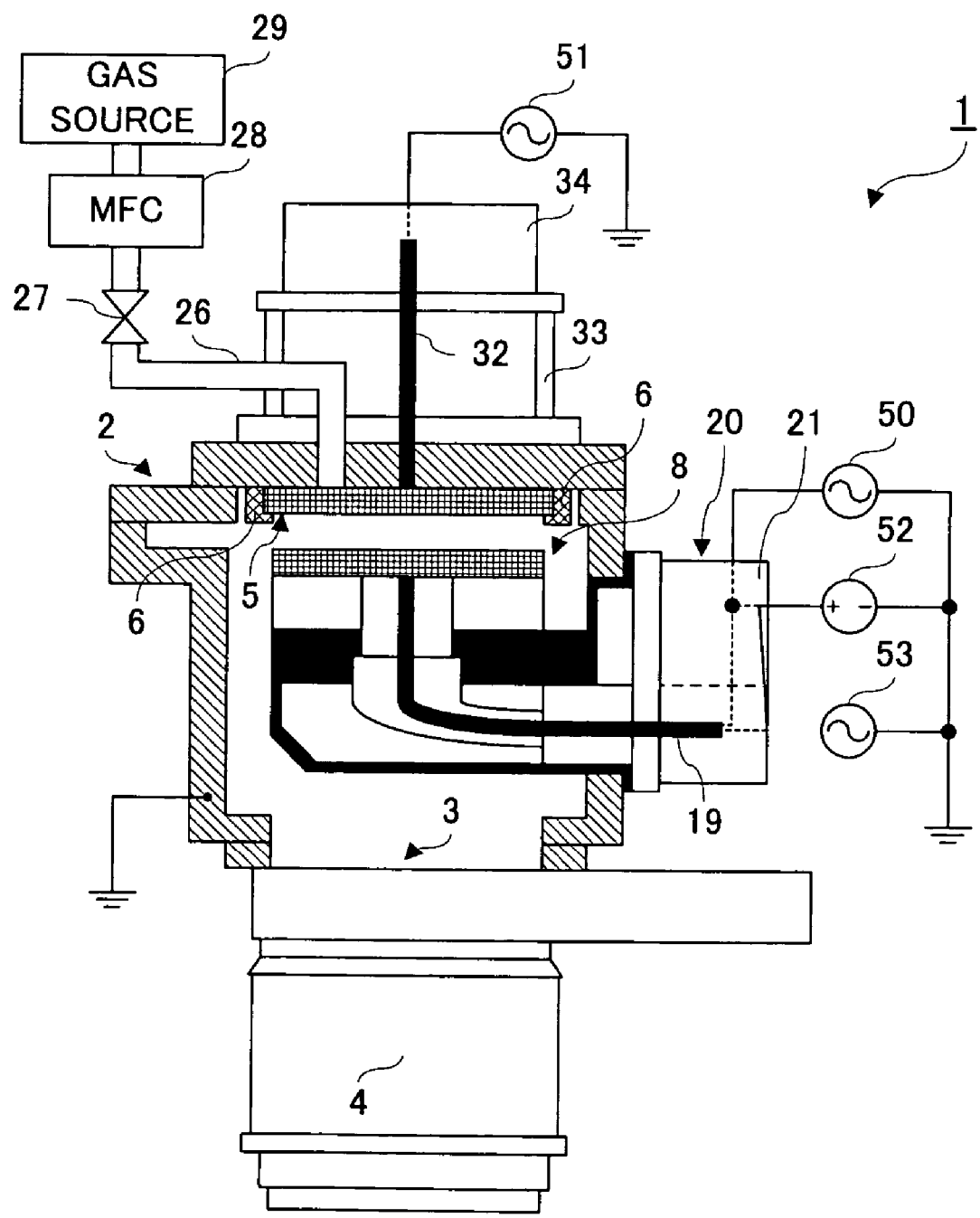
FIG. 1 is a diagram showing one example of a structure of a plasma processing apparatus according to the embodiment of the present invention.

FIG. 1 is a diagram showing one example of a structure of a plasma processing apparatus 1 according to the embodiment of the present invention.

This plasma processing apparatus 1 is constituted as a so-called parallel plate type plasma processing apparatus having electrodes opposed to each other in parallel one above the other, and has a function for forming a film such as an $SiO_2$ film, etc. on the surface of a semiconductor substrate (hereinafter referred to as a wafer W).

With reference to FIG. 1, the plasma processing apparatus 1 comprises a cylindrical vacuum container 2. The vacuum container 2 is made of a conductive material such as aluminum, etc. to which an almite process (anodic oxidation process) is applied. The vacuum container 2 is grounded.

An exhaust pipe 3 is connected to the bottom of the vacuum container 2, and the exhaust pipe 3 is connected to a pump 4. The pump 4 is an exhaust device constituted by a turbo molecular pump (TMP) and the like, and can exhaust the vacuum container 2 of the air until the inside of the vacuum container 2 reaches a predetermined pressure.

Figure 2:
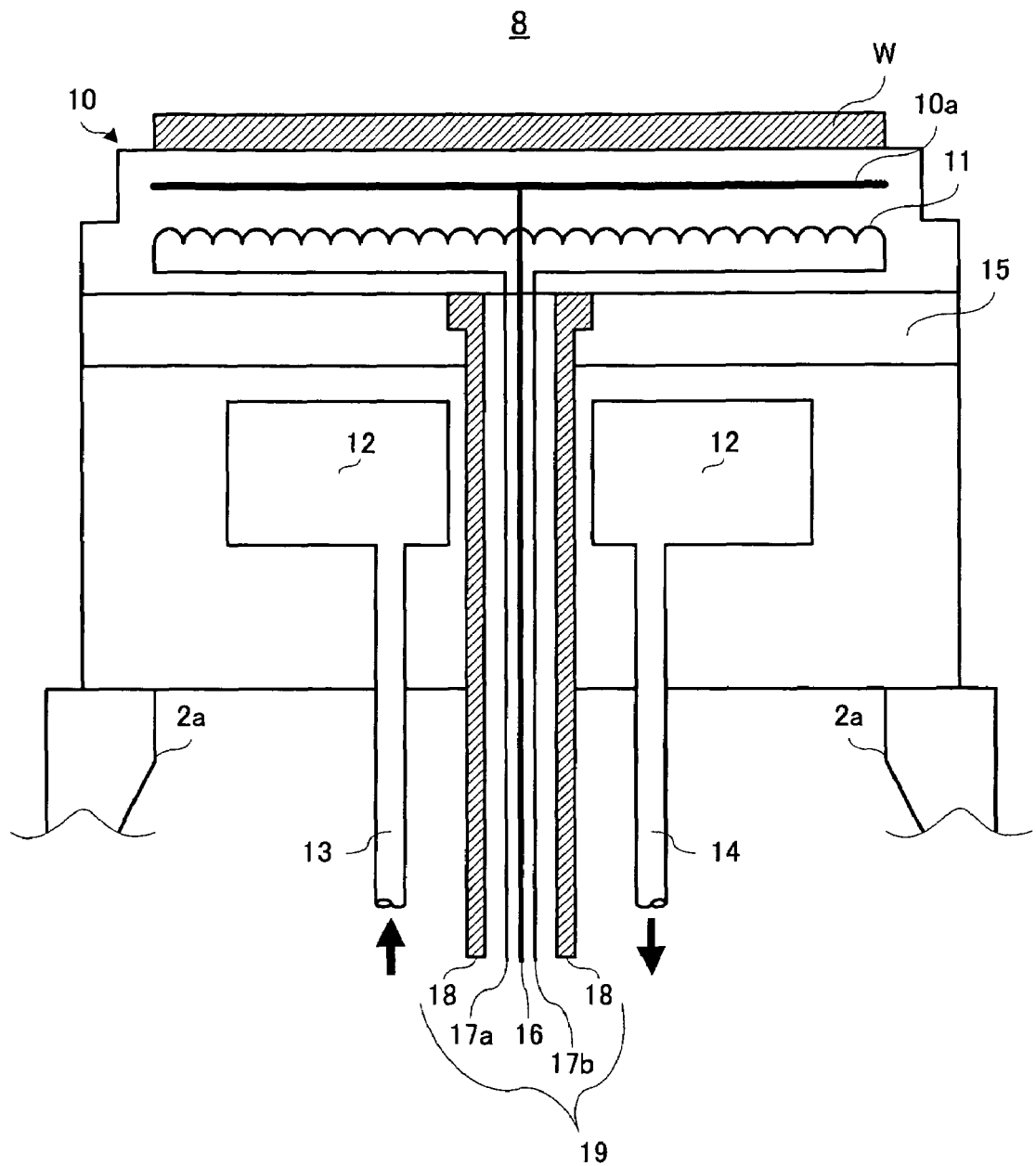
FIG. 2 is a diagram showing one example of a structure of a susceptor, etc. provided at the lower portion of a vacuum container.

A susceptor 8 for placing a wafer W thereon is provided at the lower center of the vacuum container 2. FIG. 2 is a diagram showing one example of a structure of the susceptor 8, etc. The susceptor 8 is made of, for example, aluminum nitride (AlN) formed as a cylindrical shape. An electrostatic chuck 10 is placed and fixed on the upper surface of the susceptor 8, and the susceptor 8 functions as a lower electrode for generating plasma in the process space inside the vacuum pump 2.

The electrostatic chuck 10 is structured by disposing a conductive sheet 10a made of, for example, a copper foil plate, etc. between two upper and lower insulation layers made of, for example, polyimide films, and attracts a wafer W by Coulomb force to fix the wafer W thereon.

A heater 11 for heating the wafer W to a predetermined temperature is provided in the susceptor 8. A refrigerant jacket 12 for circulating a refrigerant is provided so as to sandwich a thermoconductive plate 15 between itself and the heater 11. An introduction pipe 13 and a discharge pipe 14 are connected to the refrigerant jacket 12, and a refrigerant supplied from the introduction pipe 13 circulates through the refrigerant jacket 12 and is discharged from the discharge pipe 14. The bottom surface of the susceptor 8 is supported by a ground member 2a which is a part of the inner wall of the vacuum container 2.

For example, inner conductive sticks 16, 17a, and 17b, and an outer conductive pipe 18 are connected to the susceptor 8. Through these sticks and pipe, the susceptor 8 receives high frequency electricity generated by a first high frequency power source 50, and functions as a lower electrode for introducing plasma toward the wafer W inside the vacuum container 2. Further, the inner conductive sticks 16, 17a, and 17b, and the outer conductive pipe 18 function as an electricity supply stick 19 for supplying electricity to the lower electrode.

The inner conductive stick 16 is connected to the conductive sheet 10a comprised by the electrostatic chuck 10, and conducts a high frequency electricity generated by the first high frequency power source 50 and a direct current voltage generated by a direct current power source 52. The inner conductive sticks 17a and 17b are connected to the heater 11, and conduct electricity supplied from a commercial power source 53 and having a commercial frequency. The outer conductive pipe 18 is a pipe arranged so as to cover the inner conductive sticks 16, 17a, and 17b.

As shown in FIG. 1, a matching box 20 having a matching circuit unit 21 is provided between the susceptor 8, and the first high frequency power source 50, direct current power source 52, and commercial power source 53. The electricity supply stick 19 is drawn out from the external wall on the side surface of the vacuum container 2, such that it can be attached to the matching box 20.

The matching circuit unit 21 is provided for obtaining a match between the output impedance of the first high frequency power source 50 and the input impedance of the susceptor 8 functioning as the lower electrode. Further, the matching circuit unit 21 superimposes a voltage for plasma introduction supplied from the first high frequency power source 50 on a direct current voltage supplied from the direct current power source 52 via a filter circuit constituted by an LPF (Low Pass Filter) or the like, and outputs the superimposed voltage.

The matching box 20 couples the commercial power source 53 to the inner conductive sticks 17a and 17b, to enable supply of electricity having a commercial frequency to the heater 11. A filter circuit constituted by an LPF or the like for preventing a high frequency electricity from being diverted into the commercial power source 53 may be provided between the matching box 20 and the commercial power source 53.

A shower head 5 having multiple gas ejection holes is provided to the ceiling of the vacuum container 2 that is opposed to a placement surface of the susceptor 8 for placing the wafer W. The circumference of the shower head 5 is fixed to the vacuum container 2 by bolts and the like, and is covered with an insulation member 6 formed annularly. The insulation member 6 is made of quartz whose surface is covered with an insulation film made of, for example, alumina ($Al_2O_3$) ceramics having a high corrosion-resistant property.

Figure 3:
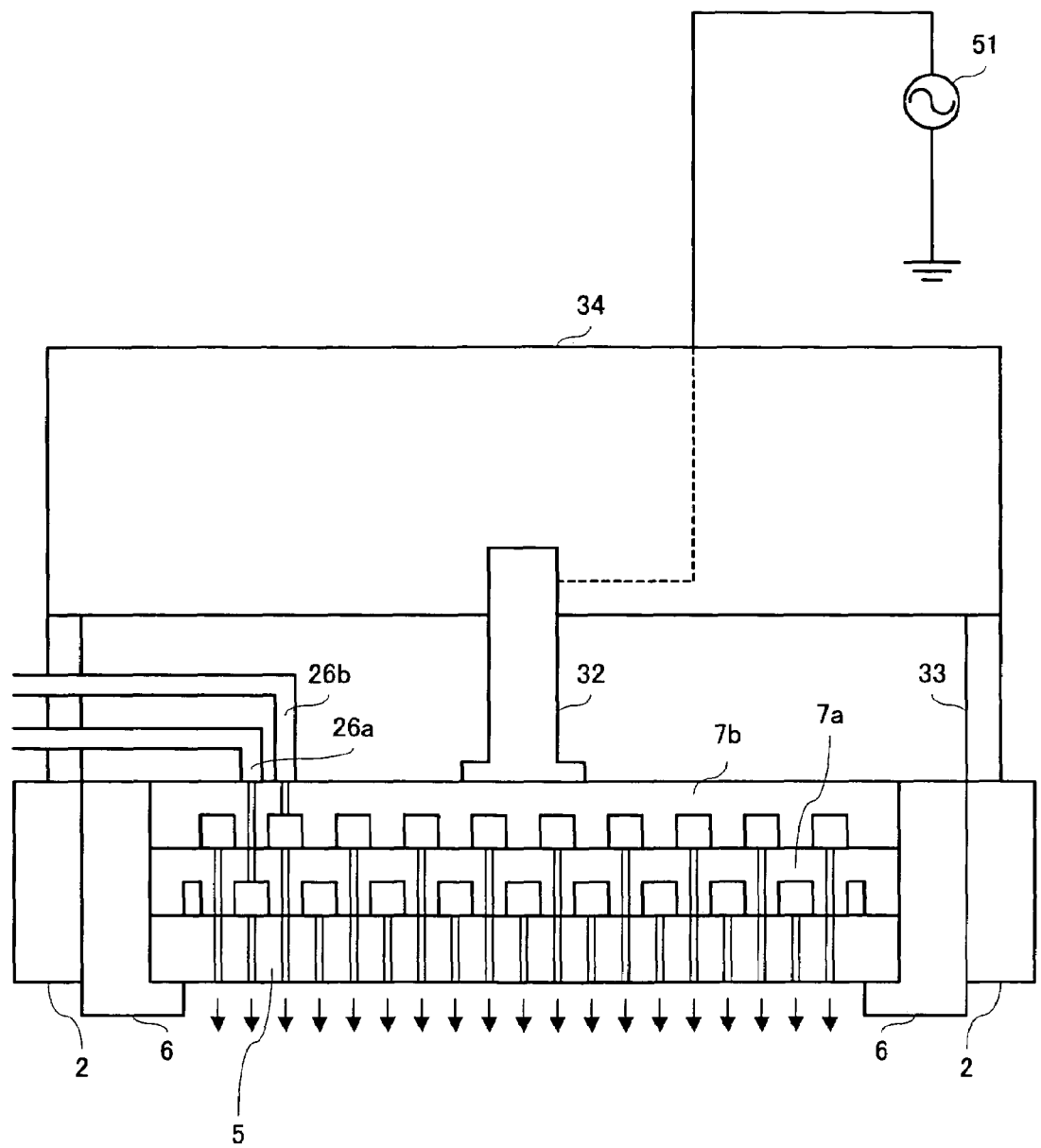
FIG. 3 is a diagram showing one example of a structure of the upper portion of a vacuum container.

FIG. 3 is a diagram showing one example of a structure of the upper portion of the vacuum container 2 in detail. For example, two diffusion plates 7a and 7b are arranged at the upper portion of the shower head 5. A plasma generation gas, a material gas, etc. are supplied to the diffusion plates 7a and 7b from gas pipes 26a and 26b which are connected to the top of the diffusion plates 7a and 7b. A gas pipe 26 including the gas pipes 26a and 26b is connected to a gas supply source 29 via a valve 27 and an MFC (Mass Flow Controller) 28 as shown in FIG. 1, so that material gases such as $SiH_4$, and $O_2$, and a plasma generation gas such as an Ar gas can be supplied from the shower head 5 into the vacuum container 2. The gas pipe 26, the valve 27, the MFC 28, and the gas supply source 29 are provided in an appropriate plural number in accordance with the kinds of gases to be provided into the vacuum container 2. However, FIG. 1 shows one of each of these. The number and structure of the diffusion plates 7a and 7b may be changed appropriately in accordance with the kinds of gases to be supplied from the gas supply source 29.

An electricity supply stick 32 is coupled and fixed by screws, etc. onto the upper surface of the diffusion plate 7b at the center. By supplying a high frequency electricity generated by a second high frequency power source 51 to the shower head 5, the electricity supply stick 32 makes the shower head 5 function as an upper electrode for generating plasma of a material gas, etc. in the vacuum container 2.

An impedance matching device 34 is arranged above the vacuum container 2 via a shield box 33. The impedance matching device 34 is provided for obtaining a match between the output impedance of the second high frequency power source 51 and the input impedance of the shower head 5 functioning as the upper electrode.

Figure 4:
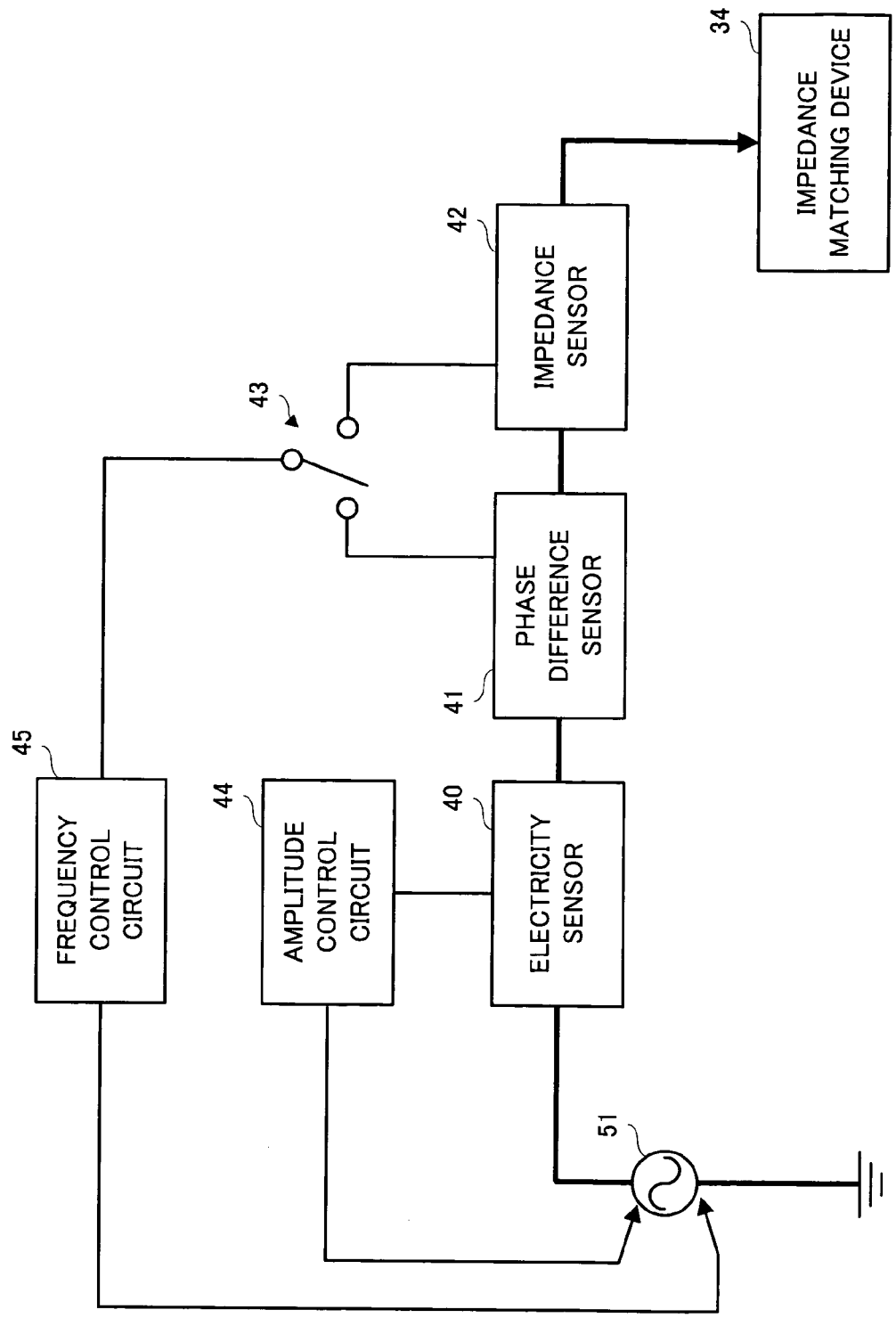
FIG. 4 is a diagram showing a structure of a connection part between an impedance matching device and a second high frequency power source.

FIG. 4 is a diagram showing a structure of a connecting part between the impedance matching device 34 and the second high frequency power source 51. As illustrated, a power sensor 40, a phase difference sensor 41, an impedance sensor 42, a selection circuit 43, an amplitude control circuit 44, and a frequency control circuit 45 are provided to the connection part between the impedance matching device 34 and the second high frequency power source 51.

The power sensor 40 measures the electricity of a progressive wave from the second high frequency power source 51 and the electricity of a reflected wave to the second high frequency power source 51 at an input terminal of the impedance matching device 34 and calculates a difference between the measured electricity values, thereby measuring the electricity of a high frequency to be supplied from the second high frequency power source 51 to the impedance matching device 34.

The phase difference sensor 41 is provided for measuring a phase difference between a voltage component and a current component of a high frequency electricity to be input to the impedance matching device 34.

The impedance sensor 42 is provided for measuring the level of the input impedance of the impedance matching device 34. The impedance sensor 42 obtains a current flowing to the input terminal of the impedance matching device 34 and a voltage of the input terminal, and derives the input impedance from current/voltage.

The selection circuit 43 is provided for switching selection between the phase difference sensor 41 and the impedance sensor 42, and transmitting results of detecting both of them to the frequency control circuit 45.

The amplitude control circuit 44 is provided for controlling the level of a high frequency electricity output by the second high frequency power source 51, based on a supply electricity (effective electricity) supplied to the impedance matching device 34 and measured by the power sensor 40. That is, the amplitude control circuit 44 makes it possible for stable plasma to be generated in the process space inside the vacuum container 2 by adjusting an output electricity of the second high frequency power source 51 such that the supply electricity (effective electricity) measured by the power sensor 40 becomes a preset setting value. For example, the amplitude control circuit 44 adjusts the level of a high frequency electricity to be output from the second high frequency power source 51, by controlling a gain of a variable-gain amplifier included in the second high frequency power source 51.

The manner for the amplitude control circuit circuit 44 to control the amplitude of an output signal from the second high frequency power source 51 is arbitrary. Therefore, the known proportion (P) control, integration (I) control, differentiation (D) control, and controls based on the combination of those (PI control, PID control), etc. can be used.

For example, if it is assumed that a change amount of the amplitude of an output signal from the second high frequency power source 51 is ΔA, a difference between an electricity measured by the power sensor 40 and the set value is ΔP, and a, b, and c are coefficients, the control can be performed in accordance with the equations below.

$$\Delta A = a \cdot \Delta P$$

$$\Delta A = a \cdot \Delta P + \int b \cdot \Delta P$$

$$\Delta A = a \cdot \Delta P + \int b \cdot \Delta P + c \cdot d\Delta P/dt$$

The frequency control circuit 45 is provided for controlling an oscillation frequency of the second high frequency power source 51 based on a phase difference between a voltage component and a current component measured by the phase difference sensor 41 and the input impedance of the impedance matching device 34 measured by the impedance sensor 42. For example, the second high frequency power source 51 adjusts the oscillation frequency within a range of ±10% of a predetermined reference frequency, so that the phase difference between a voltage component and current component of a high frequency electricity to be input to the impedance matching device 34 becomes 0, or that the level of the input impedance of the impedance matching device 34 becomes 50Ω.

The manner for the frequency control circuit 45 to control the frequency of the second high frequency power source 51 is arbitrary. Therefore, the known proportion control, integration control, differentiation control, and controls based on the combination of those can be used.

For example, if it is assumed that a change amount of the oscillation frequency of the second high frequency power source 51 is Δf, the phase difference between the voltage component and the current component measured by the phase difference sensor 41 is, and a, b, and c are coefficients, the control can be performed in accordance with the following equation.

$$\Delta f = a \cdot + \int b \cdot + c \cdot d/dt$$

Further, for example, if it is assumed that a change amount of the oscillation frequency of the second high frequency power source 51 is Δf, a difference between the input impedance of the impedance matching device 34 and 50Ω is ΔΩ, and d, e, and f are coefficients, the control can be performed in accordance with the following equation.

$$\Delta f = d \cdot \Delta \Omega + \int e \cdot \Delta \Omega + f \cdot d\Delta \Omega/dt$$

Figure 5:
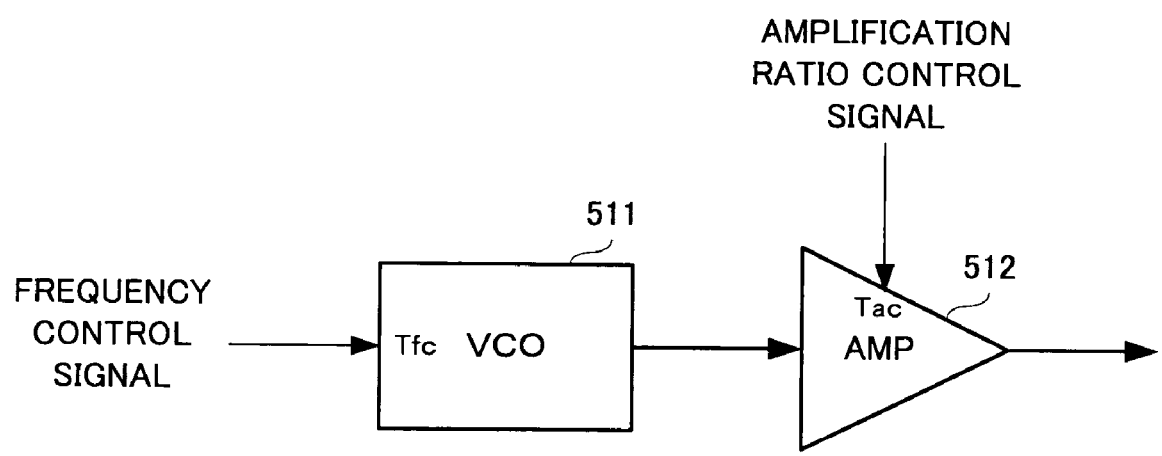
FIG. 5 is a diagram showing an example of a structure representing a structure of a second high frequency power source.

FIG. 5 shows an example of a circuit structure of the second high frequency power source 51. As illustrated, the second high frequency power source 51 comprises a voltage control oscillator (VCO) 511 and a high frequency amplifier 512.

The voltage control oscillator 511 includes, for example, a PLL circuit and the like, and oscillates at a frequency subject to a control signal supplied to an oscillation frequency control terminal Tfc from the frequency control circuit 45.

The high frequency amplifier 512 has a structure of a variable gain type, and amplifies an oscillation signal output from the voltage control oscillator 511 by a gain subject to a control signal supplied to a gain control terminal Tac from the amplitude control circuit 44 and outputs the amplified oscillation signal.

Figure 6:
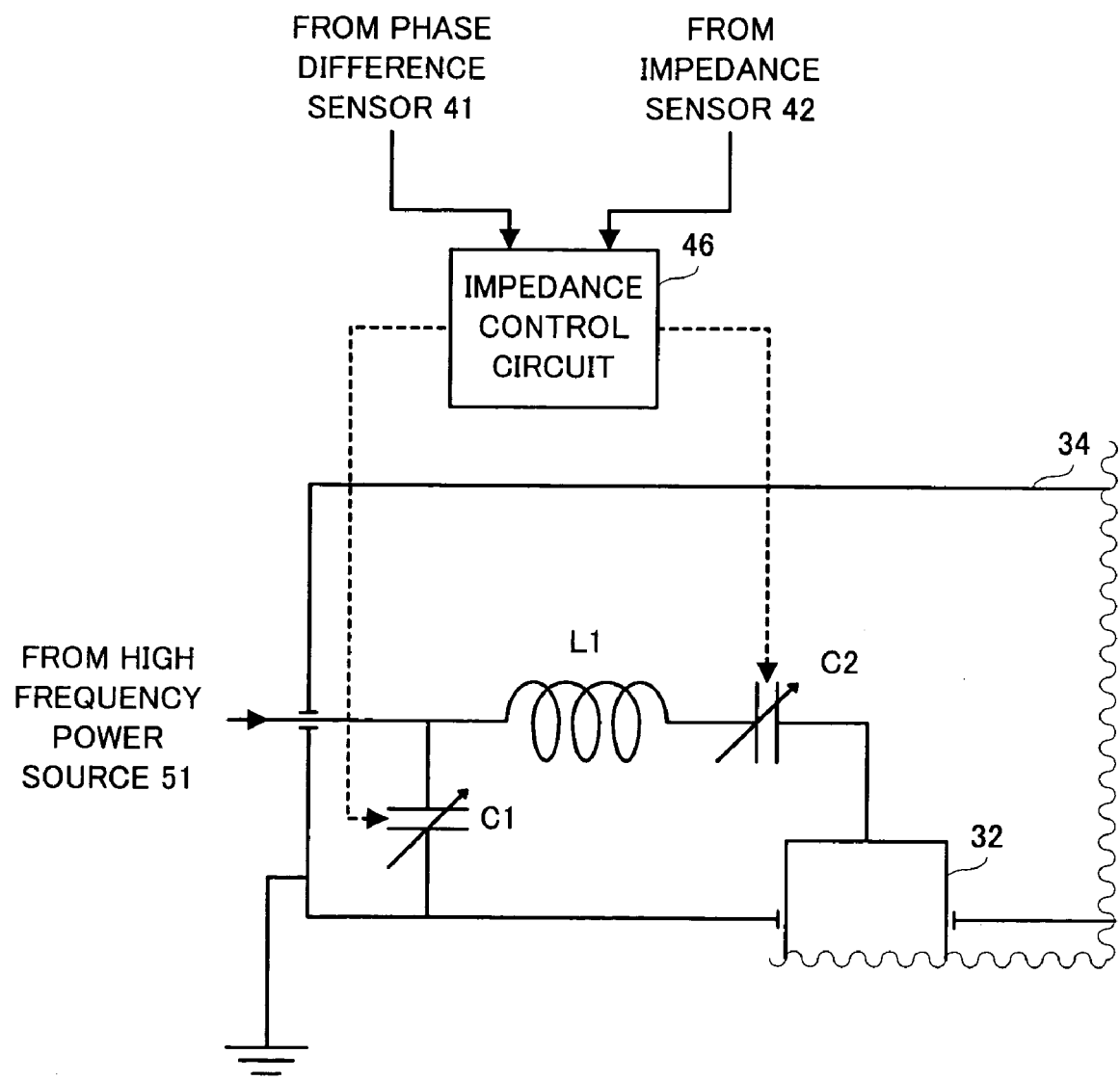
FIG. 6 is a diagram showing one example of a structure of an impedance matching device.

The impedance matching device 34 comprises variable capacitors C1 and C2, and an inductor L1 as shown in, for example, FIG. 6. The capacitances of the variable capacitors C1 and C2 are controlled by an impedance control circuit 46 at, for example, an initial setting time in each process for processing the wafer W placed on the susceptor 8, in order to match the output impedance of the second high frequency power source 51 and the input impedance to the shower head 5.

The impedance control circuit 46 comprises a CPU (Central Processing Unit) or the like including, for example, a ROM (Read Only Memory) and a RAM (Random Access Memory), and is provided for controlling the impedance of the impedance matching device 34. That is, the impedance control circuit 46 adjusts the impedance of the impedance matching device 34 when a process condition in the process space inside the vacuum container 2 is changed, to perform initial setting of the impedance corresponding to each process condition. For example, the impedance control circuit 46 matches the output impedance of the second high frequency power source 51 and the input impedance to the shower head 5 at around an initial value for the impedance which is predetermined in accordance with a process condition, by rotation-driving a motor for rotating (or translating) electrodes of the variable capacitors C1 and C2 included in the impedance matching device 34.

To be more specific, the impedance control circuit 46 adjusts the capacitance of the variable capacitor C1 at an initial setting stage of each process, based on a phase difference between a voltage component and current component which are measured by the phase difference sensor 41. For example, the impedance control circuit 46 adjusts the capacitance of the variable capacitor C1, so that the phase difference between the voltage component and current component of a high frequency electricity to be input to the impedance matching device 34 at the initial setting stage of each process will be 0.

Further, the impedance control circuit 46 adjusts the capacitance of the variable capacitor C2 at the initial setting stage of each process, based on the level of the input impedance to the impedance matching device 34 which is measured by the impedance sensor 42. For example, the impedance control circuit 46 adjusts the capacitance of the variable capacitor C2, so that the level of the input impedance to the impedance matching device 34 will be 50Ω at the initial setting stage of each process.

The impedance control circuit 46 has a switching function, and can switch so that it adjusts the capacitance of the variable capacitor C2 based on a measurement result of the phase difference sensor 41 and adjusts the capacitance of the variable capacitor C1 based on a measurement result of the impedance sensor 42.

The impedance control circuit 46 stores control data for adjusting the impedance of the impedance matching device 34 to correspond to a match point which is predicted before a wafer W is processed, for each of a plurality of process conditions for processing the wafer W in the vacuum container 2, and adjusts the capacitances of the variable capacitors C1 and C2 based on the control data. The control data is data for matching the impedances by limiting the variable range of the variable capacitors C1 and C2 to a certain range which includes a match point predicted for each process condition and which is restricted narrower than the entire variable range of the variable capacitors C1 and C2.

The manner for the impedance control circuit 46 to control the capacitances of the variable capacitors C1 and C2 is arbitrary, and the P control, the PI control, and the PID control, etc. which are described above can be used.

Figure 7:
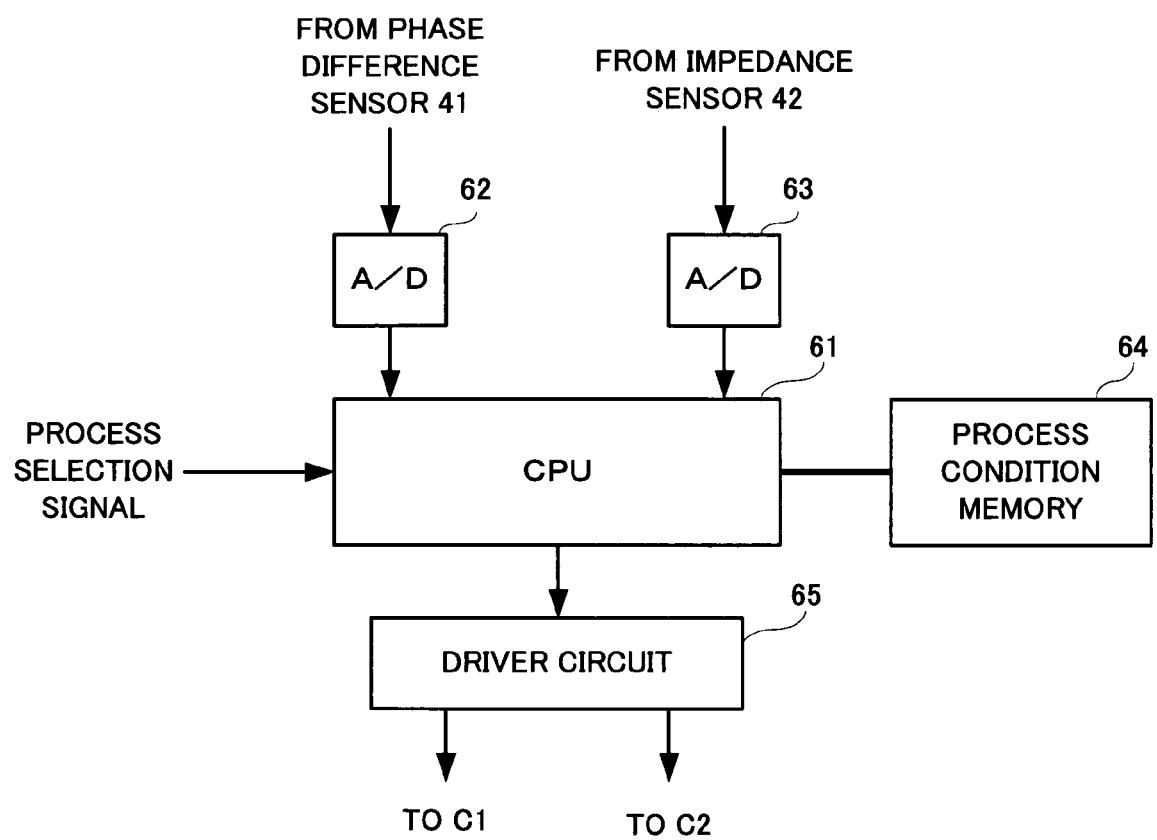
FIG. 7 is a diagram showing an example of a structure representing a structure of an impedance control circuit shown in FIG. 6.

FIG. 7 shows an example of a circuit structure of the impedance control circuit 46. As illustrated, the impedance control circuit 46 comprises a CPU 61, A/D (analog/digital) converters 62 and 63, a process condition memory 64, and a driver circuit 65.

The A/D converter 62 A/D-converts a signal from the phase difference sensor 41 representing a phase difference between a current and a voltage, and supplies the signal to the CPU 61.

The A/D converter 63 A/D-converts a signal representing a phase difference between a current indicative of an impedance from the impedance sensor 42 and a voltage, and supplies the signal to the CPU 61.

The process condition memory 64 is constituted by a non-volatile memory, and stores control data representing preset initial values of the capacitances of the capacitors C1 and C2 and variable ranges, for a plurality of process conditions, as shown in FIG. 8. The control data is generated beforehand by calculation or based on experimental results. As the control data, for example, capacitances of the variable capacitors C1 and C2 at which it is predicted that a match point for each process condition exists, i.e. initial values for matching the impedances at the initial setting stage of each process are stored. Further, a change change range for changing the capacitances of the variable capacitors C1 and C2 while each process is performed is stored. This change range is set as a narrower range than a range (entire variable range) in which the capacitances of the variable capacitors C1 and C2 is variable.

The driver circuit 65 changes the capacitances of the capacitors C1 and C2 by moving the electrodes of the capacitors C1 and C2 in accordance with an instruction from the CPU 61.

At the beginning of a process, the CPU 61 instructs the driver circuit 65 in accordance with a process instruction signal supplied from a process control apparatus or a control panel, to adjust the capacitances of the variable capacitors C1 and C2 so that the impedance of the impedance matching device 34 matches a match point predicted before a wafer W is processed. Further, after a process is started, the CPU 61 matches the output impedance of the high frequency power source 52 and the input impedance of the upper electrode by limiting the variable range of the variable capacitors C1 and C2 to a certain range which includes a match point predicted for each process condition and which is restricted narrower than the entire variable range of the variable capacitors C1 and C2, in accordance with a signal from the phase difference sensor 41 and a signal from the impedance sensor 42.

An operation of the plasma processing apparatus 1 according to the embodiment of the present invention will be explained below.

When a wafer W is to be processed by the plasma processing apparatus 1, the wafer W is transported from, for example, an unillustrated load lock room and placed on the susceptor 8. At this time, the wafer W is attractively fixed, by applying a direct current voltage generated by the direct current power source 52 to the conductive sheet 10a of the electrostatic chuck 10. Then, the pump 4 is driven to vacuum the inside of the vacuum container 2 to a predetermined vacuum level. When the predetermined vacuum level is reached, the valve 27 is opened. And a predetermined gas supplied from the gas supply source 29, for example, a plasma generation gas such as an Ar gas is introduced with its flow rate controlled by the MFC 28 into the gas pipe 26, then supplied into the vacuum container 2 by the shower head 5, and kept at a predetermined pressure.

Further, the inside of the vacuum container 2 is heated by the heater 11, and a predetermined material gas such as an $SiH_4$ gas and an $O_2$ gas is supplied from the gas supply source 29. The heater 11 heats the inside of the vacuum container 2 so that the temperature of the wafer W will be a predetermined process temperature within 400° C. to 600° C.

The first and second high frequency power sources 50 and 51 are activated to begin supply of high frequency electricity, so that the material gas, etc. are plasma-decomposed and a laminated film is deposited on the wafer W. At this time, the first high frequency power source 50 applies a negative bias voltage to the conductive sheet 10a in order to attract ions to the wafer W. The frequency of the first high frequency power source 50 is determined based on a vibration frequency and the like of the plasma ion inside the vacuum container 2, and is set to the maximum of approximately 10

MHz, and preferably to approximately 2 MHz. The second high frequency power source 51 generates and outputs a high frequency electricity having a predetermined frequency within, for example, 27 MHz to 100 MHz, preferably a frequency of 60 MHz.

The CPU 61 of the impedance control circuit 46 reads out the control data stored in the process condition memory 64 at the initial setting stage of each process and adjusts the impedance of the impedance matching device 34. As described above, the control data is generated beforehand by calculation or based on experimental results, and stored in the process condition memory 64. According to this control data, the capacitances of the variable capacitors C1 and C2 at which it is predicted that a match point for each process condition exists, are set as the initial values for matching the impedances at the initial setting stage of each process.

The impedance control circuit 46 varies the capacitances of the variable capacitors C1 and C2 in accordance with the control data, within a predetermined range which is restricted narrower than the entire variable range of the variable capacitors C1 and C2, to adjust the impedance of the impedance matching device 34. For example, let it be assumed that the process for the wafer W to be performed in the vacuum container 2 includes a first and a second processes P1 and P2, the initial value of the capacitance of the variable capacitor C1 that is preset for the first process P1 is C11, and the initial value of the capacitance of the variable capacitance C1 that is preset for the second process P2 is C12. Here, the initial values C11 and C12 are respectively values corresponding to match points which are reproductive in the first and second processes P1 and P2. The initial values C11 and C12 are stored in the process condition memory 64 shown in FIG. 8.

Figure 9A:
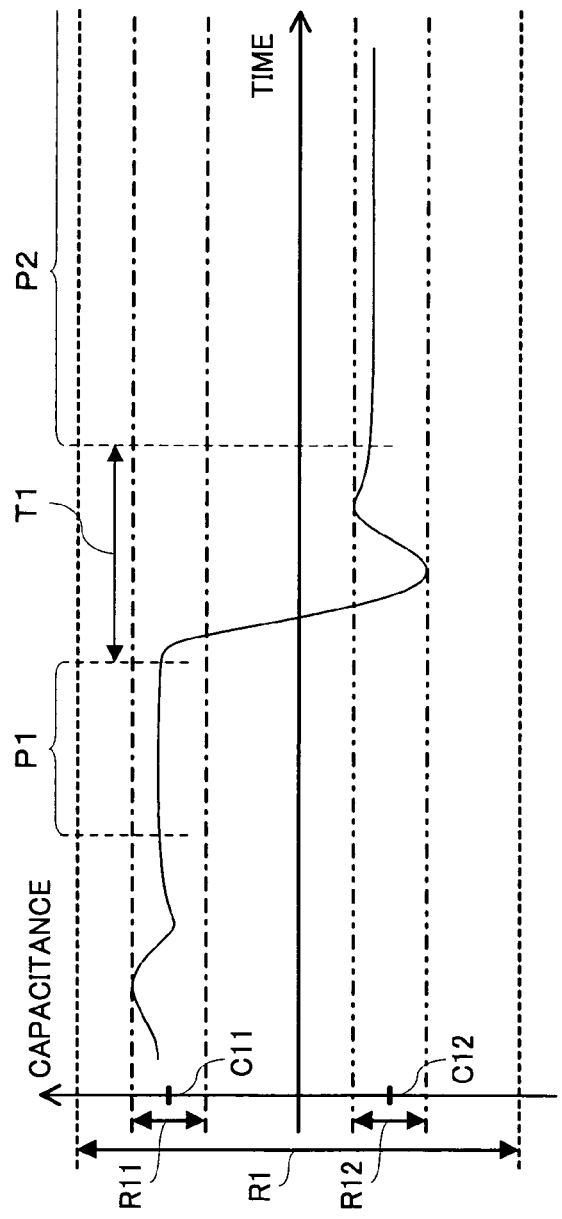
FIG. 9A is a diagram showing changes in the capacitance of a variable capacitor in a case where the variable range is narrowly restricted.

In this case, the impedance control circuit 46 adjusts the capacitance of the variable capacitor C1 at around the initial value C11 at the initial setting stage of the first process P1, so that the impedance of the plasma load and the output impedance of the second high frequency power source 51 will match. That is, the impedance control circuit 46 adjusts the capacitance of the variable capacitor C1 within a variable range R11 which is preset for the first process P1 as shown in FIG. 9A, in order to match the impedances at around the initial value C11. Note that a variable range R11 is limited narrower than the entire variable range R1 of the capacitance of the variable capacitor C1.

Here, the output impedance of the second high frequency power source 51 is normally 50Ω. The characteristic impedance of a coaxial cable used as a wiring for connecting the second high frequency power source 51 and the impedance matching device 34 is also normally 50Ω. Accordingly, the impedance control circuit 46 can obtain a match of the impedances by adjusting the capacitances of the variable capacitors C1 and C2 so that the level of the input impedance to the impedance matching device 34 will be 50Ω and a phase difference between a voltage component and a current component of a high frequency electricity input to the impedance matching device 34 will be 0.

Next, when the second process P2 is to start after the first process P1 is finished, the capacitance of the variable capacitor C1 is adjusted to around the initial value C12 preset for the second process P2 so that the impedances are matched. That is, the impedance matching circuit 46 adjusts the capacitance of the variable capacitor C1 within a variable range R12 preset for the second process P2 as shown in FIG. 9A, in order to match the impedances at around the initial value C12. This variable range R12 is also restricted narrower than the entire variable range R1 of the capacitance of the variable capacitor C1.

Figure 9B:
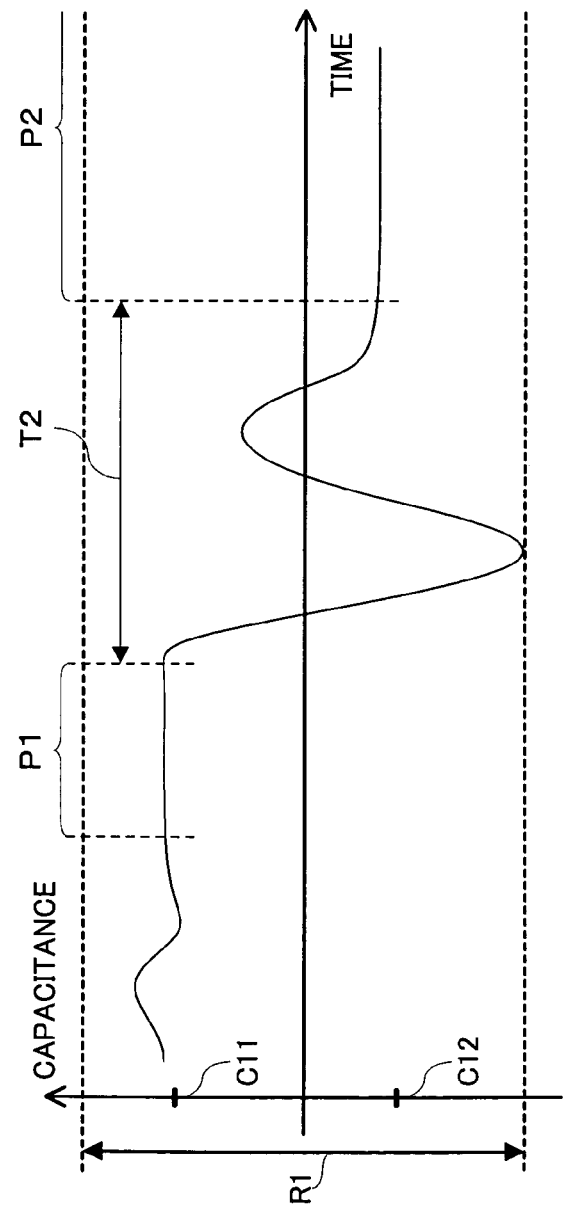
FIG. 9B is a diagram showing changes in the capacitance of a variable capacitor in a case where the variable range is not restricted.

FIG. 9B is a diagram showing changes in the capacitance of the variable capacitor C1, in a case where the impedance of the impedance matching device 34 is adjusted without such restrictions as described on the variable ranges. As obvious from FIGS. 9A and 9B, by adjusting the capacitance of the variable capacitor C1 within the variable ranges R11 and R12 which are preset for the first and second processes P1 and P2, it is possible to shorten the time (matching time) required for the shift from the first process P1 to the second process P2. That is, T1<T2 is achieved in FIGS. 9A and 9B.

Also for the capacitance of the variable capacitor C2, the impedance control circuit 46 presets predetermined ranges that correspond to the respective process conditions and are restricted narrower than the entire variable range of the capacitance of the variable capacitor C2. Based on the preset ranges, the impedance control circuit 46 performs adjustment for matching the impedances at an initial setting stage of each process.

Because the impedances are matched by restricting the variable ranges of the variable capacitors C1 and C2 when a process condition changes with another, it is possible to shorten the time required for matching the impedances at the initial setting stage of each process. Further, it is possible to avoid an accidental match at an unstable match point, and to thereby generate stable plasma in the vacuum container 2.

There is a case where the impedance of the plasma load changes after a match of the impedances is obtained at the initial setting stage of each process, due to fluctuation of the plasma density in the vacuum container 2, etc. In this case, the frequency control circuit 45 reduces a reflected wave from the plasma load by restricting the oscillation frequency of the second high frequency power source 51 based on measurement results of the phase difference sensor 41 and the impedance sensor 42.

The impedances of the reactance elements constituting the impedance matching device 34 such as the variable capacitors C1 and C2 and the inductor L1 change in accordance with frequency. Accordingly, if the oscillation frequency of the second high frequency power source 51 is changed, the impedance of the impedance matching device 34 is also changed. Based on this, the impedance of the plasma load and the impedance of the second high frequency power source 51 can be matched and a reflected wave from the plasma load to the second high frequency power source 51 can be reduced. Further, because the oscillation frequency of the second high frequency power source 51 can be electronically controlled, the impedance of the impedance matching device 34 can be adjusted rapidly and precisely in accordance with a change in the impedance of the plasma load.

At this time, the amplitude control circuit 44 can make plasma to be generated in the vacuum container 2 stable so that the wafer W can be processed appropriately, by adjusting the output electricity of the second high frequency power source 51 in a manner that the supply electricity (effective electricity) measured by the power sensor 40 is kept at a fixed amount.

In a case where, for example, an $SiH_4$ gas and an $O_2$ gas are supplied as material gases, these gases are ionized in the process space in the vacuum container 2, and thus an $SiO_2$ film is deposited on the wafer W. When the deposition of the laminated film is finished, supply of the discharge electricity, introduction of the material gases, and heating of the inside of the vacuum container 2 are stopped, and the inside of the vacuum container 2 is sufficiently purged and cooled. Thereafter, the wafer W is taken out.

As explained above, according to the present embodiment, the impedance of the impedance matching device 34 is controlled to obtain a match, by adjusting the capacitances of the variable capacitors within ranges preset for each process at the initial setting stage of the process for processing the wafer W. Therefore, it is possible to obtain a match of the impedances in a short time at the initial setting stage of each process and to shorten the time required for processing of a substrate.

Further, according to the present embodiment, it is possible to keep the electricity to be supplied to the plasma load constant, by matching the impedances by controlling the oscillation frequency and output electricity of the second high frequency power source 51 by the amplitude control circuit 44 and the frequency control circuit 45. Due to this, it is possible to adjust the impedance rapidly and precisely in accordance with a change in the impedance of the plasma load, and thereby to process the wafer W by generating stable plasma.

The present invention is not limited to the above-described embodiment, but can be variously modified and applied. For example, the above-described embodiment explains that after a match is obtained by the impedance control circuit 46 adjusting the impedance of the impedance matching device 34 at the initial setting stage of each process, the oscillation frequency and output electricity of the second high frequency power source 51 are controlled by the amplitude control circuit 44 and the frequency control circuit 45. However, the present invention is not limited to this, but a match of the impedances may be obtained by controlling the oscillation frequency and output electricity of the second high frequency power source 51 by the amplitude control circuit 44 and the frequency control circuit 45 also at the initial setting stage of each process.

Further, according to the above-descried embodiment, the control for matching the impedances is performed in the circuit for supplying a high frequency electricity to the shower head 5 which functions as the lower electrode. However, the present invention is not limited to this, but a similar control may be performed in a circuit for supplying a high frequency electricity to the susceptor 8 which functions as the lower electrode.

Further, the variable capacitors C1 and C2 of the impedance matching device 34 need not to be constituted limitedly by those which have electrodes whose positions are changed, but may be constituted by variable capacitance diodes or the like. Further, the impedance matching device 34 needs not to comprise those which have variable capacitances, but may comprise variable inductors. In this case, a similar control to that of the case of comprising variable capacitors can be performed by storing in the impedance control circuit 46, control data which is suited to the variable inductors. That is, the impedance matching device 34 needs only to comprise variable reactance elements, whose element constants can be adjusted by the impedance control circuit 46.

Further, the plasma processing apparatus 1 of the present invention needs not to comprise all of the components described above, but may comprise a part of those. For example, the plasma processing apparatus 1 may be so structured as to comprise the amplitude control circuit 44 and the frequency control circuit 45, but not the impedance control circuit 46. Further, the plasma processing apparatus 1 may be so structured as not to comprise the amplitude control circuit 44 and the frequency control circuit 45, but comprise the impedance control circuit 46.

The structure of the plasma processing apparatus 1 may be arbitrarily changed. For example, the plasma processing apparatus 1 may comprise a coil or a permanent magnet for causing a predetermined magnetic field around the vacuum container 2, in order to process the wafer W by utilizing electron cyclotron resonance.

Further, the present invention is not limited to a plasma processing apparatus for performing a plasma CVD process, but may be applied to an etching apparatus, a ashing apparatus, etc. as long as they are an apparatus for supplying a high frequency electricity to a shower head and a susceptor and plasma-processing a process target such as a semiconductor wafer, an LCD substrate, and a solar battery substrate.

This application is based on Japanese Patent Application No. 2001-380196 filed on Dec. 13, 2001 and including specification, claims, drawings and summary. The disclosure of the above Japanese Patent Application is incorporated herein by reference in its entirety.

INDUSTRIAL APPLICABILITY

The present invention can be applied to a plasma processing apparatus such as a semiconductor manufacturing apparatus, and a liquid crystal display element manufacturing apparatus, and to a plasma processing method.

The invention claimed is:

1. A plasma processing apparatus comprising:
   a vacuum container (2) in which a substrate is processed with use of a plasma gas;
   a plasma generation electrode (5) which is provided in said vacuum container;
   a high frequency power source (51) which generates a high frequency electricity to be supplied to said plasma generation electrode (5);
   an impedance matching device (34) which matches an input impedance of said plasma generation electrode (5) and an output impedance of said high frequency power source (51);
   an impedance sensor (42) which measures a level of an input impedance of said impedance matching device;
   a frequency control circuit (45) which controls an oscillation frequency of said high frequency power source based on a measurement result from said impedance sensor; and
   a phase difference sensor (41) which measures a phase difference between a voltage component and a current component of an electricity to be supplied to said impedance matching device,
   wherein said frequency control circuit (45) controls the oscillation frequency of said high frequency power source based on measurement results from said phase difference sensor and said impedance sensor.

2. The plasma processing apparatus according to claim 1, further comprising:
   an power sensor (40) which measures an electricity to be supplied to said impedance matching device from said high frequency power source; and
   an output control circuit (44) which controls an output electricity of said high frequency power source based on a measurement result from said power sensor.

3. The plasma processing apparatus according to claim 2, comprising a selector (43) which switches selection between said phase difference sensor (41) and said impedance sensor (42) to obtain measurement results from both of them, wherein said frequency control circuit (45) controls the oscillation frequency of said high frequency power source (51) based on measurement results sequentially obtained due to selections made by said selector (43).

4. The plasma processing apparatus according to claim 2, wherein:
said output control circuit (44) controls the output electricity of said high frequency power source (51) to keep an electricity to be supplied to said impedance matching device constant; and
said frequency control circuit (45) controls the oscillation frequency of said high frequency power source (51) to match the input impedance of said impedance matching device (34) and the output impedance of said high frequency power source (51).

5. The plasma processing apparatus according to claim 2, wherein said impedance matching device (34) comprises:
variable reactance elements (C1, C2), for matching the input impedance of said plasma generation electrode (5) and the output impedance of said high frequency power source (51); and
an impedance control circuit (46) which controls element constants of said variable reactance elements (C1, C2) within a range which is preset for each process and which is restricted narrower than an entire variable range of said variable reactance elements.

6. A plasma processing apparatus comprising:
a vacuum container (2) in which a substrate is processed with use of a plasma gas;
a plasma generation electrode (5) which is provided in said vacuum container;
a high frequency power source (51) which generates a high frequency electricity to be supplied to said plasma generation electrode (5);
an impedance matching device (34) which matches an input impedance of said plasma generation electrode (5) and an output impedance of said high frequency power source (51);
an impedance sensor (42) which measures a level of an input impedance of said impedance matching device;
a frequency control circuit (45) which controls an oscillation frequency of said high frequency power source based on a measurement result from said impedance sensor; and
further comprising:
an power sensor (40) which measures an electricity to be supplied to said impedance matching device from said high frequency power source; and
an output control circuit (44) which controls an output electricity of said high frequency power source based on a measurement result from said power sensor.

7. A plasma processing apparatus comprising:
a vacuum container (2) in which a process target is processed with use of a plasma gas;
a plasma generation electrode (5) which is provided in said vacuum container (2);
a high frequency power source (51) which generates a high frequency electricity to be supplied to said plasma generation electrode;
an impedance matching device (34) which includes variable reactance elements (C1, C2) in order to match an input impedance of said plasma generation electrode (5) and an output impedance of said high frequency power source (51);
an impedance control circuit (46) which controls element constants of said variable reactance elements (C1, C2) included in said impedance matching device (34) within a range which is preset for each process for processing the process target and which is restricted narrower than an entire variable range of the element constants of said variable reactance elements (C1, C2);
a phase difference sensor (41) which measures a phase difference between a voltage component and a current component of an electricity supplied to the impedance matching device (34) from said high frequency power source (51); and
an impedance sensor (42) which measures an input impedance of said impedance matching device (34),
wherein said impedance control circuit (46) controls a capacitance of a first variable capacitor (C1) included in said impedance matching device (34) based on a measurement result from said phase difference sensor (41), and controls a capacitance of a second variable capacitor (C2) included in said impedance matching device (34) based on a measurement result from said impedance sensor (42).

8. A control method of a plasma processing apparatus which comprises a vacuum container in which a substrate is processed with use of a plasma gas, a plasma generation electrode which is provided in said vacuum container, a high frequency power source which generates a high frequency electricity to be supplied to said plasma generation electrode, and an impedance matching device which matches an input impedance to said plasma generation electrode and an output impedance of said high frequency power source, said method comprising:
measuring by an power sensor, an electricity to be supplied to said impedance matching device based on a difference between an electricity of a progressive wave from said high frequency power source and an electricity of a reflected wave to said high frequency power source;
controlling by output control means, an output electricity of said high frequency power source based on a measurement result from said power sensor;
measuring by a phase difference sensor, a phase difference between a voltage component and a current component of an electricity to be supplied to said impedance matching device;
measuring by an impedance sensor, a level of an input impedance to said impedance matching device; and
controlling by frequency control means, an oscillation frequency of said high frequency power source based on measurement results from said phase difference sensor and said impedance sensor.

9. The control method according to claim 8, wherein:
said output control means controls the output electricity of said high frequency power source to keep an electricity to be supplied to said impedance matching device constant by controlling the output electricity of said high frequency power source; and
said frequency control means controls the oscillation frequency of said high frequency power source to match the input impedance to said impedance matching device and the output impedance of said high frequency power source.

* * * * *